US 6,618,270 B2

(12) United States Patent
Babin et al.

(10) Patent No.: US 6,618,270 B2
(45) Date of Patent: Sep. 9, 2003

(54) SYSTEM AND METHOD FOR SHIELDING ELECTRONIC COMPONENTS

(75) Inventors: André Babin, Chicoutimi (CA); Daniel Bindley, Chicoutimi (CA)

(73) Assignee: Trioniq Inc., Chicoutimi (CA)

( * ) Notice: Subject to any disclaimer, the term of this patent is extended or adjusted under 35 U.S.C. 154(b) by 0 days.

(21) Appl. No.: 09/793,535

(22) Filed: Feb. 27, 2001

(65) Prior Publication Data

US 2002/0118529 A1 Aug. 29, 2002

(51) Int. Cl.[7] ................................................. H05K 9/00
(52) U.S. Cl. ....................... 361/818; 361/800; 361/816; 174/35 R
(58) Field of Search ................................ 361/725–730, 361/752–753, 796, 800, 816–818, 756, 797, 799; 174/35 R, 35 MS

(56) References Cited

U.S. PATENT DOCUMENTS

| | | | |
|---|---|---|---|
| 4,717,990 A | 1/1988 | Tugeu | |
| 5,023,754 A * | 6/1991 | Aug et al. | ................... 361/748 |
| 5,420,760 A | 5/1995 | Ansell et al. | |
| 5,652,697 A * | 7/1997 | Le | .............................. 174/35 R |
| 5,661,640 A | 8/1997 | Mills et al. | |
| 5,774,330 A | 6/1998 | Melton et al. | |
| 5,774,337 A | 6/1998 | Lee et al. | |
| 5,835,343 A | 11/1998 | Johns et al. | |
| 5,999,416 A | 12/1999 | McAnally et al. | |
| 6,023,415 A | 2/2000 | Mayer et al. | |
| 6,049,469 A * | 4/2000 | Hood, III et al. | ............ 361/818 |
| 6,053,771 A * | 4/2000 | Hood, III et al. | ............ 439/607 |
| 6,137,051 A | 10/2000 | Bundza | |
| 6,195,259 B1 * | 2/2001 | Whitman et al. | ............ 361/725 |
| 6,201,711 B1 * | 3/2001 | Chernisky et al. | ........... 361/800 |
| 6,307,754 B1 * | 10/2001 | Le et al. | ...................... 361/796 |
| 6,411,517 B1 * | 6/2002 | Babin | ...................... 211/41.17 |

* cited by examiner

Primary Examiner—Kamand Cuneo
Assistant Examiner—Tuan Dinh
(74) Attorney, Agent, or Firm—Ogilvy Renault; Robert Mitchell

(57) ABSTRACT

An EMI shielded system in which a motherboard is permanently shielded behind a shielding plate defining an aperture for each corresponding connector carried by the motherboard so as to allow expansion cards or the like to be connected to the motherboard without having to unshield the latter. The expansion cards are preferably separately mounted and shielded within respective loading cartridges.

13 Claims, 3 Drawing Sheets

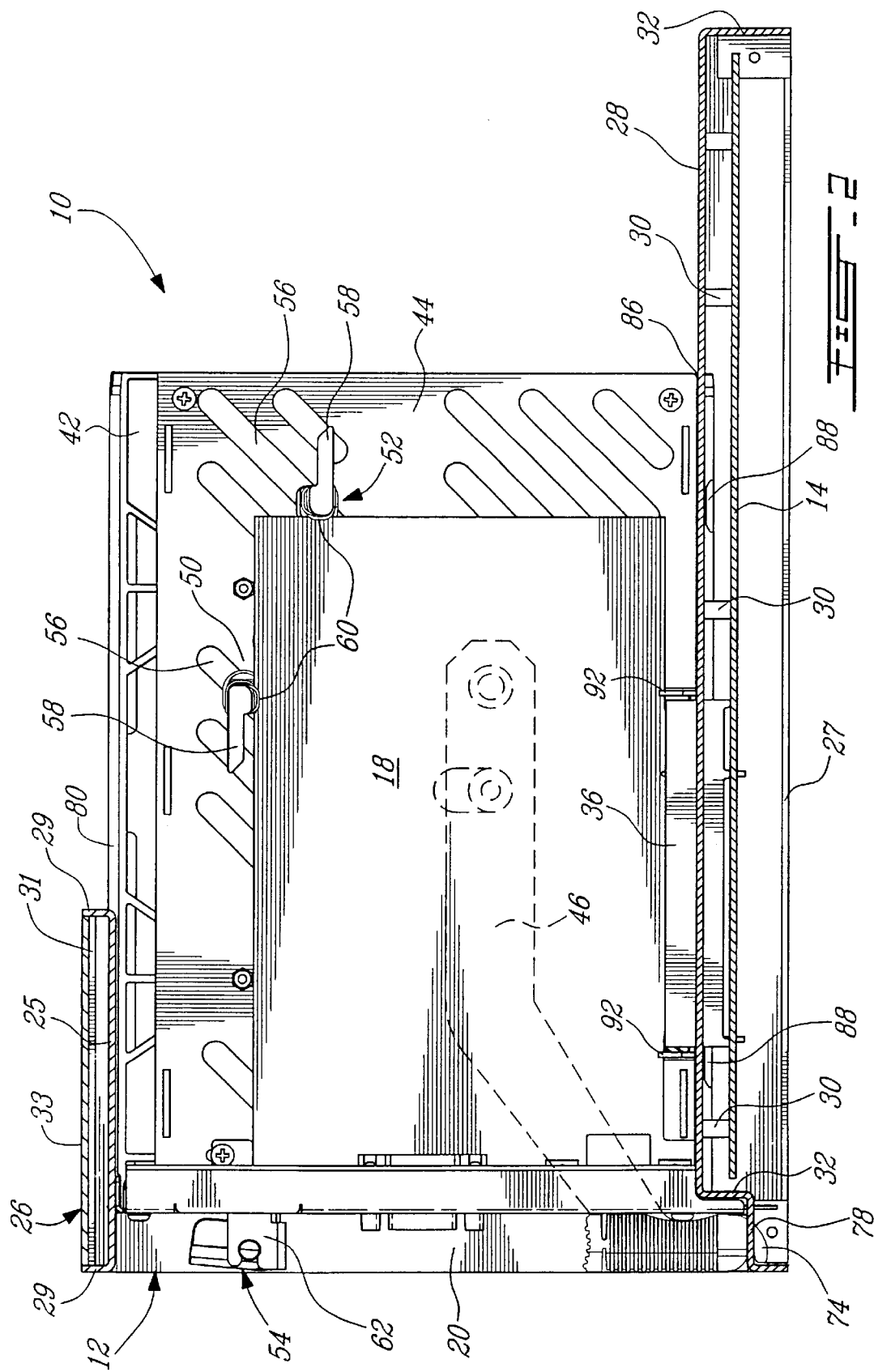

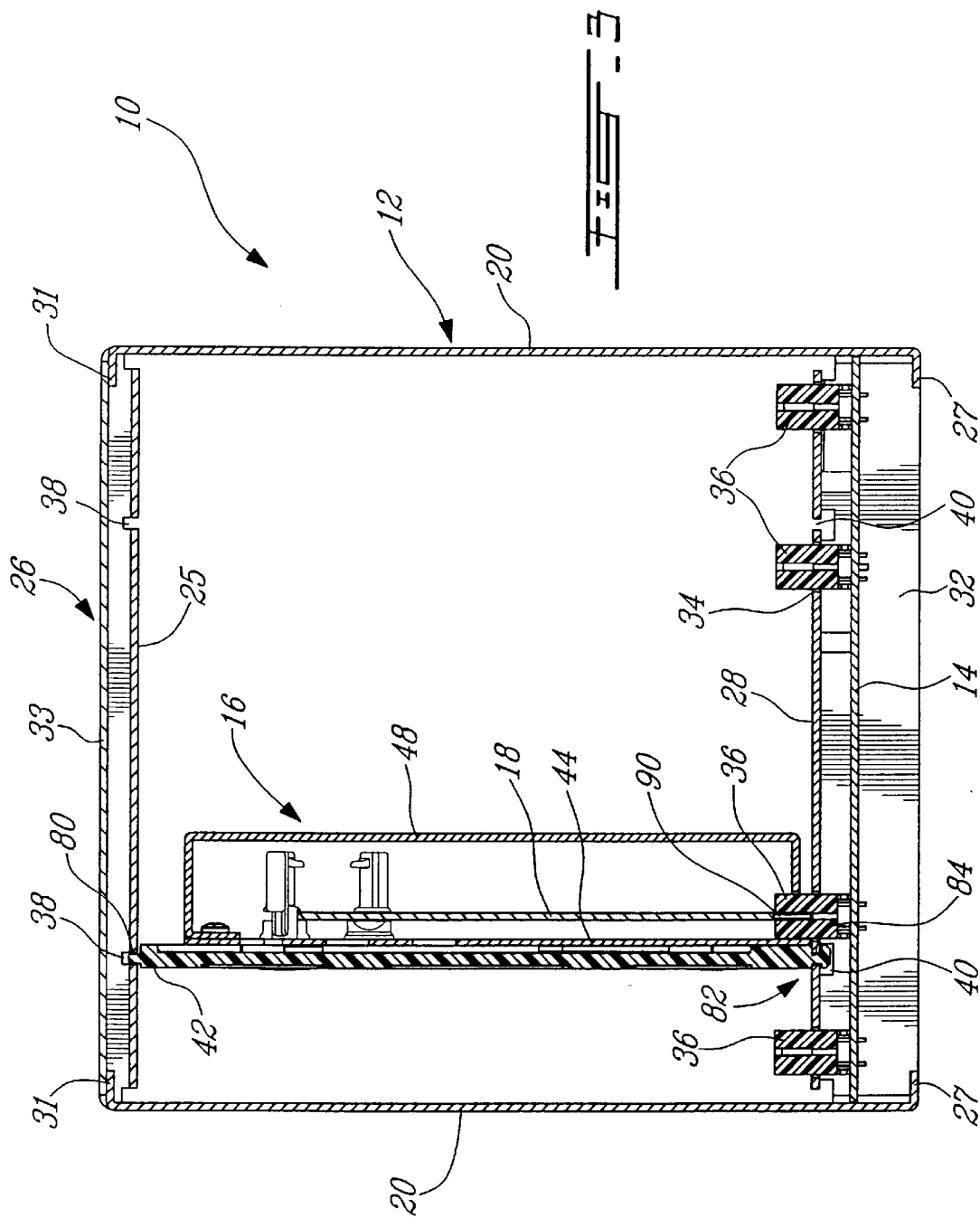

SYSTEM AND METHOD FOR SHIELDING ELECTRONIC COMPONENTS

BACKGROUND OF THE INVENTION

1. Field of the Invention

The present invention relates to electronic equipment, such as computers and, more particularly, to an apparatus and method for providing electromagnetic interference (EMI) shielding to some of the electrical components of an electronic device.

2. Description of the Prior Art

Electronic components, such as printed circuit boards, generate electromagnetic interference (EMI) radiation. Such EMI radiation must be substantially prevented from escaping outwardly through the housing in which the electronic components are mounted. Moreover, it is also desirable that the EMI radiation generated by the electronic components be contained to avoid interfering with the operation of other electronic components. To this end, it has been proposed to mount printed circuit boards within a metallic chassis upon which a cover can be installed to provide EMI shielding. However, when it is desired to connect peripheral electronic devices, such as expansion cards, to the main printed circuit board of the device, one has first to remove the cover and thus unshield the main printed circuit board to have access to the electrical connectors thereof. The unshielded main printed circuit board can then be operatively connected to the peripheral device.

It would be desirable to have a new shielding structure in which individual electronic components are shielded from one another and are adapted to be connected to each other without having to be unshielded.

SUMMARY OF THE INVENTION

It is therefore an aim of the present invention to provide a shielding method and apparatus in which individual electronic components can be operatively connected without having to be unshielded.

It is also an aim of the present invention to provide a new shielding apparatus which facilitates the connection of an expansion card to a main printed circuit board of an electronic device.

It is a further aim of the present invention to provide a shielding apparatus for reducing the risk that respective electronic components of two electronic devices be damaged during installation procedures.

Therefore, in accordance with the present invention, there is provided a computer chassis in combination with a motherboard having at least one electrical connector extending from a surface thereof and to which additional electronic components are operatively connectable, comprising a support structure for supporting the motherboard, an EMI shield overlying said surface of said motherboard for shielding the motherboard from other electronic components, said support structure defining on a side of said shield opposite to said motherboard a space for receiving the additional electronic components, and at least one aperture defined in said shield for exposing said at least one electrical connector of the motherboard, thereby allowing the motherboard to be operatively connected to the additional electronic components without having to be unshielded.

In accordance with a further general aspect of the present invention, there is provided an electromagnetic interference (EMI) radiation shielded system for connecting at least one expansion card to a main printed circuit board of an electronic device, comprising a chassis, a main printed circuit board mounted within the chassis, an EMI shield overlying the main circuit board and defining one corresponding aperture for each electrical connector extending from the main printed circuit board, an EMI shielded loading cartridge housing an expansion card having at least one exposed connector accessible from outside said loading cartridge, said chassis defining a space for receiving said loading cartridge in a position wherein said at least one exposed connector of said expansion card operatively mates with a corresponding exposed connector of said main printed circuit board.

In accordance with a further general aspect of the present invention, there is provided a method of shielding interconnectable electronic components, comprising the steps of: mounting a first electronic component within a chassis behind an electromagnetic interference (EMI) shield defining one corresponding aperture for each electrical connector carried by the first electronic component, mounting a second electronic component in an EMI shielding module with a connector of said second electronic component remaining accessible from outside of said shielding module, mounting said EMI shielding module within said chassis with corresponding connectors of said first and second electronic components in mating engagement.

In accordance with a further general aspect of the present invention, there is provided a method of shielding electronic components, comprising the steps of: providing a number of electronic components on a planar board, providing an electromagnetic interference (EMI) radiation shielding plate, defining in said shielding plate one corresponding aperture for each electrical connector extending from said planar board, mounting said planar board and said shielding plate within a chassis with said shielding plate overlying said planar board and each said electrical connector in registry with a corresponding aperture in said shielding plate.

BRIEF DESCRIPTION OF THE DRAWINGS

Having thus generally described the nature of the invention, reference will now be made to the accompanying drawings, showing by way of illustration a preferred embodiment thereof, and in which:

FIG. 2 is a side elevational view, partly in cross-section, of the apparatus of FIG. 1; and FIG. 3 is a front cross-sectional view of the apparatus of FIG. 1.

DESCRIPTION OF THE PREFERRED EMBODIMENTS

Figure 1:
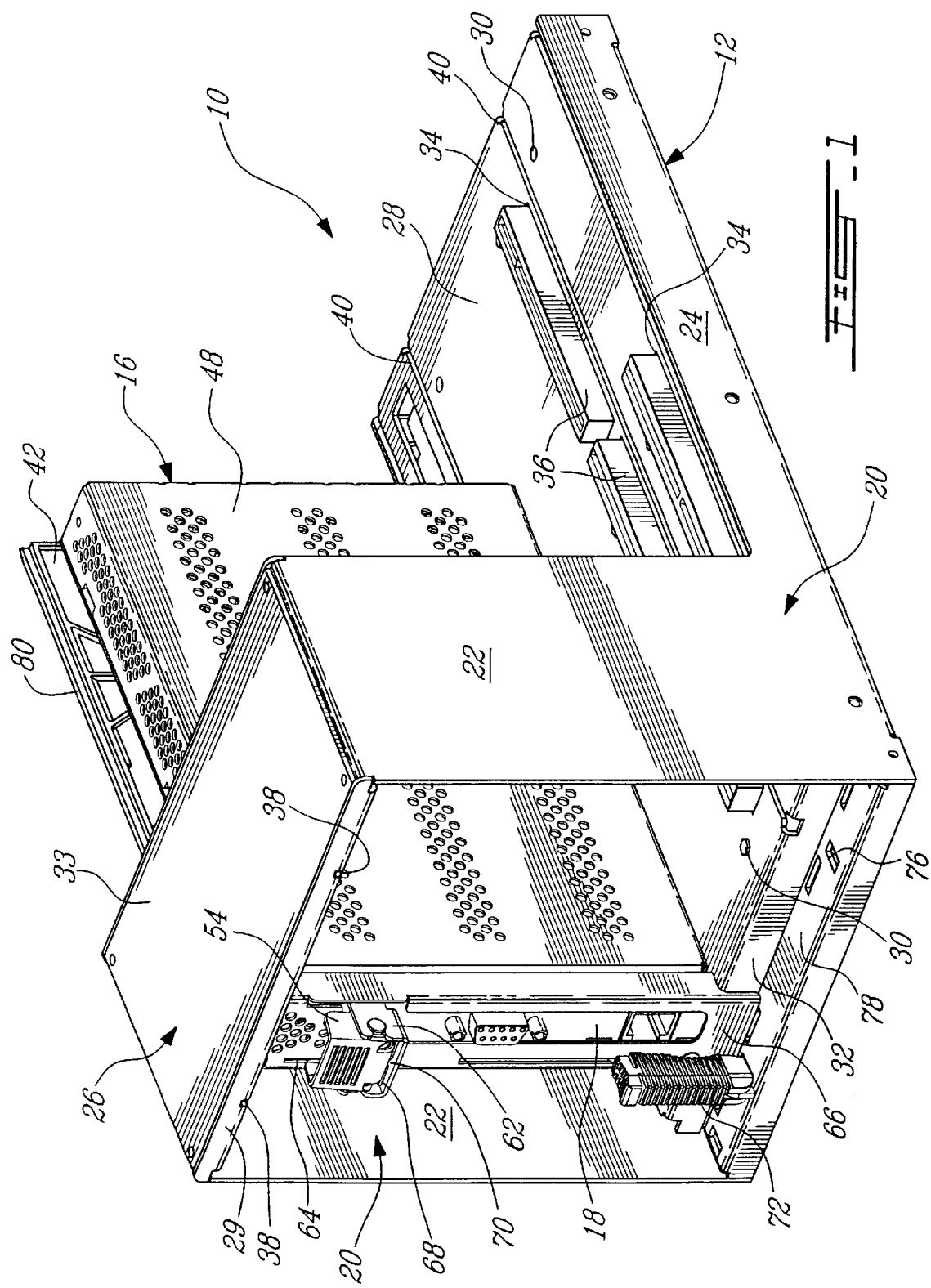
FIG. 1 is a perspective view of a new apparatus for EMI shielding electronic components in accordance with a first embodiment of the present invention.

Now referring to FIG. 1, an apparatus for EMI shielding interconnectable electronic components while allowing the components to be operatively connected together without having to be unshielded will be described.

For the purposes of example, the present EMI shielding apparatus is herein described in the form of a computer system 10 comprising a support structure or a chassis 12 adapted to house electronic components, such as a main printed circuit board or motherboard 14 (FIGS. 2 and 3), as well as other electronic devices adapted to be plugged into the motherboard 14. More specifically, as illustrated in FIG.

1, the chassis 12 is adapted to removably receive a number of side by side EMI shielded loading cartridges or units, one of which is shown at 16. Each loading cartridge 16 houses an electronic component, such as an expansion card 18, to be operatively connected to the motherboard 14.

As seen in FIGS. 1 to 3, the chassis 12 is preferably of a metallic sheet construction and includes spaced-apart L-shaped side walls 20. Each side wall 20 has a front upstanding portion 22 and an elongated bottom portion 24 extending integrally rearwardly from a bottom end of the front upstanding portion 22. A top wall structure 26 extends between the front upstanding portions 22 of the L-shaped side walls 20 and defines a front bay through which the loading cartridges 16 can be removably inserted into the chassis 12.

As seen in FIG. 2, the top wall structure 26 can include a horizontal plate 25 having front and rear upwardly folded end portions 29. The horizontal plate 25 is fastened to inturned lip portions 31 (FIG. 3) projecting laterally inwardly from the upper edges of the front upstanding portions 22 of the side walls 20. A cover plate 33 can also be secured to the lips 31 between the front and rear upwardly folded end portions 29 of the horizontal plate 25.

Inturned mounting lips 27 (FIGS. 2 and 3) project laterally inwardly from the bottom edges of the elongated bottom portions 24 of the L-shaped side walls 20. Holes (not shown) are defined in the mounting lips 27 for allowing the chassis 12 to be securely mounted to a support surface (not shown).

The chassis 12 further includes a bottom EMI shielding plate 28 mounted between the L-shaped side walls 20 for overlying the top surface of the motherboard 14. The EMI shielding plate 28 is preferably fastened to the L-shaped side walls 20 by means of threaded fasteners, such as screws. According to a construction of the present invention, the shielding plate 28 is also permanently secured in parallel to the motherboard 14 at a distance from the top surface thereof by means of a plurality of fasteners, such as rivets 30, extending therebetween, thereby allowing the motherboard 14 and the shielding plate 28 to be assembled as a single unit to the interconnected side walls 20, which act as a support structure therefor.

As best seen in FIG. 2, the EMI shielding plate 28 is provided with front and rear downwardly depending lip portions 32. The lip portions 32 cooperate with the side wall 20 to form a transverse electromagnetic mode (TEM) radiation edge shielding for the motherboard 14 to prevent the passage of EMI radiation outwardly of the chassis 12. Electromagnetic interference radiation discharged from the electronic components mounted on the top planar surface of the substrate of the motherboard 14 are prevented from escaping from above by the horizontal portion of the shielding plate 28 overlying the motherboard 14. By so mounting the motherboard 14 of an electronic device, such as a computer, behind an EMI shielding plate 28 with the edges of the motherboard 14 peripherally surrounded by an EMI shielding structure, it becomes possible to substantially entirely shield the motherboard 14 from electromagnetic interference radiation.

As best shown in FIG. 1, one aperture 34 is defined in the EMI shielding plate 28 for each corresponding electrical connector 36 extending from the top surface of the motherboard 14. This advantageously allows peripheral electronic devices to be connected to the motherboard 14 without having to unshield the latter. Each aperture 34 is preferably sized so as to generally correspond to the contour of the associated connector 36.

As shown in FIGS. 1 and 3, a number of pairs of top and bottom guide channels 38 and 40 in the form of slotted guides are respectively defined in the top horizontal plate 25 and the bottom shielding plate 28 adjacent each row of connectors 36 for slidably receiving the loading cartridges.

Each loading cartridge 16 is preferably of the type disclosed in co-pending U.S. patent application Ser. No. 09/689,732 filed on Oct. 13, 2000, the content of which is herein incorporated by reference.

More particularly, the illustrated loading cartridge 16 generally comprises a sliding member 42, a metallic mounting plate 44 movably mounted on an inner surface of the sliding member 42, an actuator in the form of a lever 46 adapted to be manually actuated to displace the mounting plate 44 up and down on the inner surface of the sliding member 42, and an EMI shielding cover 48 adapted to be removably mounted to the mounting member 44 for joint movement therewith. As seen in FIG. 2, a number of clamping members 50, 52 and 54 are provided on the mounting plate 44 for readily releasably securing the expansion card 18 thereon without the help of any tool. According to the illustrated embodiment, the first two clamping members 50 and 52 are adjustably mounted in selected diagonal slots 56 defined in the mounting plate 44. The clamping members 50 and 52 can be releasably secured in position at a desired location in selected slots 56 in accordance with the dimensions of the expansion card 18. Any appropriate locking mechanism known in the art can be used for that purpose. Each clamping member 50/52 includes a lever 58 which can be manually pivoted for wedging the expansion card 18 behind a rib 60 forming part of the clamping member 50/52, as shown in FIG. 2.

The third clamping member 54 is pivotally mounted to a front bracket 62 extending integrally from the mounting plate 44 for movement into a slot 64 (FIG. 1) defined in a front plate 66 fixedly secured to the sliding member 42. By rotating the clamping member 54 into a substantially vertical position, as shown in FIG. 2, a forwardly projecting tongue 68 (FIG. 1) of the expansion card 18 is wedged between a bottom surface of the bracket 62 and a wedge surface 70 (FIG. 1) of the clamping member 54.

A handle 72 is mounted at the end of the lever 46. The handle 72 is provided with a latch 74 (FIG. 2) releasably engageable into a corresponding catch 76 (FIG. 1) defined in a horizontal locking surface 78 extending integrally forwardly from the front shielding lip portion 32 of the shielding plate 28.

The sliding member 42 is provided in the form of a plate having a top guiding edge 80 slidably insertable into and out of the top guide channel 38 and a bottom guiding structure 82 provided in the form of an elongated channel 84 configured to slidably receive one edge of the bottom guide channel 40 (see FIG. 3). As shown in FIG. 2, the channel 84 is formed by a continuous top rib 86 and a bottom row of ribs 88 extending laterally at right angles from a bottom portion of the inner surface of the sliding member 42.

The EMI shielding cover 48 and the mounting plate 44 form a EMI shielding enclosure for the expansion card 18 disposed in the internal spaced defined thereby. As shown in FIG. 3, the so formed EMI shielded enclosure defines a bottom opening for allowing the connectors 90 depending downwardly from the lower edge of the expansion card 18 to be operatively connected to the corresponding connectors 36 of the motherboard 14 without having to unshield the expansion card 18 or directly manipulate the same. As the expansion card 18 is shielded in its loading cartridge 16 and the motherboard 14 behind the shielding plate 28, there is virtually no risk that one of the electronic components carried by the motherboard 14 or the expansion card 18 be damaged as a result of an electrostatic shock during the installation of the expansion card 18.

When it is desired to operatively connect an expansion card 18 to the motherboard 14, one has first to attach the expansion card 18 to the mounting plate 44 via the clamping members 50, 52 and 54. Then, the EMI shielding cover 48 is secured to the mounting plate 44 to shield the expansion card 18. Thereafter, the sliding member 42 is slidably inserted into the top and bottom guide channels 38 and 40 and slidably displace to a fully inserted position wherein the connectors 90 of the expansion card 18 are in register with the corresponding connectors 36 of the motherboard 14. Once the loading cartridge 16 has been fully inserted, the lever 46 is pivoted to lower the connectors 90 of the expansion card 18 into engagement with the underlying connectors 36 of the shielded motherboard 14. As seen in FIG. 2, the latch 74 is engaged with the associated catch 76 when the lever 46 is pivoted to an operative position, wherein the connectors 90 and 36 are operatively connected. Accidental withdrawal of the expansion card 18 from the chassis 12 is further prevented by the connector receiving projections 92 extending laterally from the mounting plate 44 to receive the corresponding connector 36 therebetween once the connector 90 has been lowered into engagement with the underlying connector 36, as illustrated in FIG. 2.

The shielding plate 28, the mounting plate 44 and the shielding cover 48 are also preferably made of a heat conductive material to dissipate the heat generated by the operating electronic components.

What is claimed is:

1. A computer system in combination with a motherboard having at least one electrical connector extending from a surface thereof and to which additional electronic components are operatively connectable, comprising a support structure for supporting the motherboard, said motherboard being substantially hidden behind an EMI shield for shielding the motherboard from other electronic components, said support structure defining on a side of said shield opposite to said motherboard a space for receiving additional electronic components, and at least one aperture defined in said shield for providing access to said at least one connector of the motherboard, thereby allowing the motherboard to be operatively connected to the additional electronic components without having to be unshielded, wherein said shield is provided with at least one guide for slidably guiding an expansion card along a first axis within the support structure to an operative position for allowing said at least one connector of said motherboard to be operatively connected with a corresponding connector on the expansion card.

2. A combination as defined in claim 1, wherein said shield is secured to said supporting structure and said motherboard.

3. A combination as defined in claim 1, wherein said guide extends laterally on a side of said at least one connector of the motherboard.

4. A combination as defined in claim 1, wherein said shield includes a plate, and wherein said guide includes an elongated slot defined in said plate on a side of said at least one connector of said motherboard.

5. A combination as defined in claim 1, further including top and bottom guides for allowing an expansion card to slide into and out of said support structure, and wherein said shield includes a bottom plate extending over said motherboard, said bottom guide being provided on said bottom plate.

6. A electromagnetic interference (EMI) radiation shielded system for connecting at least one expansion card to a main printed circuit board of an electronic device, comprising a chassis, a main printed circuit board mounted within the chassis, an EMI shield overlying the main circuit board and defining one corresponding aperture for each electrical connector extending from the main printed circuit board, an EMI shielded loading cartridge adapted to house an expansion card having at least one exposed connector accessible from outside said loading cartridge, said chassis defining a space for receiving said loading cartridge in a position wherein said at least one exposed connector of said expansion card operatively mates with a corresponding exposed connector of said main printed circuit board, wherein said EMI shield is provided with a guide for slidably guiding said loading cartridge within said chassis.

7. A system as defined in claim 6, wherein said loading cartridge includes a first housing section adapted to be slidably engaged with a corresponding guiding structure provided within said chassis, and wherein said expansion card is movably connected to said first housing section.

8. A system as defined in claim 6, wherein said chassis includes first and second spaced-apart side walls made of EMI shielding material, said main printed circuit board and said EMI shield being mounted between said first and second side walls, said EMI shield having front and rear downwardly depending shielding lip portions extending transversally between said first and second side walls to EMI shield front and rear edges of said main printed circuit board, said first and second side walls and said front and rear shielding lip portions cooperating to provide a transverse electromagnetic mode (TEM) radiation shielding for said main printed circuit board.

9. A system as defined in claim 7, wherein said loading cartridge includes a second housing section, said expansion card being comprised between said first and second housing sections.

10. A system as defined in claim 7, wherein said guiding structure includes an elongated slot defined in said EMI shield for receiving a guiding edge of said first housing section.

11. A system as defined in claim 9, wherein said loading cartridge further includes a mounting member movably mounted to said first housing section, and a clamping structure for removably securing the expansion card to said mounting member.

12. A system as defined in claim 11, wherein said clamping structure includes at least one clamping member which is adjustably mounted to said mounting member for allowing expansion cards having different dimensions to be secured to said mounting member.

13. A system as defined in claim 11, wherein said mounting member includes a metallic plate slidably mounted on an inner surface of said first housing section.

* * * * *